United States Patent [19]

Nishizawa et al.

[11] 4,346,513

[45] Aug. 31, 1982

[54] METHOD OF FABRICATING SEMICONDUCTOR INTEGRATED CIRCUIT DEVICE UTILIZING SELECTIVE ETCHING AND EPITAXIAL REFILL

[75] Inventors: Junichi Nishizawa, Sendai; Masafumi Shimbo, Tokyo, both of Japan

[73] Assignees: Zaidan Hojin Handotai Kenkyu Shinkokai; Kabushiki Kaisha Daini Seikosha, both of Japan

[21] Appl. No.: 152,024

[22] Filed: May 21, 1980

[30] Foreign Application Priority Data

May 22, 1979 [JP] Japan .................................. 54-63031

[51] Int. Cl.³ .................. H01L 21/205; H01L 21/302
[52] U.S. Cl. ...................................... 29/580; 29/578;
148/175; 148/187; 156/612; 156/613; 156/647;
156/657; 156/662; 357/20; 357/22; 357/50;
357/55; 357/56; 357/60
[58] Field of Search .................. 29/578, 580; 148/175,
148/187; 156/612, 613, 614, 647, 657, 662;
356/401, 400; 357/48, 49, 50, 20, 34, 22, 60, 55, 56

[56] References Cited

U.S. PATENT DOCUMENTS

| | | | |
|---|---|---|---|
| 3,370,995 | 2/1968 | Lowery et al. | 148/175 |
| 3,412,296 | 11/1968 | Grebene | 357/49 X |
| 3,456,169 | 7/1969 | Klein | 29/571 X |
| 3,511,702 | 5/1970 | Jackson, Jr. et al. | 148/175 X |
| 3,740,276 | 6/1973 | Bean | 29/580 X |
| 3,755,012 | 8/1973 | George et al. | 148/175 |
| 3,764,409 | 10/1973 | Nomura et al. | 148/175 |
| 3,793,712 | 2/1974 | Bean et al. | 29/580 X |
| 3,938,176 | 2/1976 | Sloan | 357/49 |
| 4,056,413 | 11/1977 | Yoshimura | 156/626 X |
| 4,089,021 | 5/1978 | Sato et al. | 357/20 |
| 4,141,765 | 2/1979 | Druminski et al. | 156/647 X |
| 4,219,719 | 8/1980 | Frosien et al. | 356/401 X |

OTHER PUBLICATIONS

Doo; V. Y., "Junction Isolation . . . By Etch and Regrowth . . . ", I.B.M. Tech. Discl. Bull., vol. 8, No. 4, Sep. 1965, pp. 668-669.
Agusta et al., "Monolithic Integrated Semiconductor . . . .", I.B.M. Tech. Discl. Bull., vol. 9, No. 5, Oct. 1966, pp. 546-547.
Shimbo et al., "Defect-Free Nucleation of Silicon . . . ", J. of Crystal Growth, vol. 23, pp. 267-274, 1974.
Nishizawa et al., "Anisotropy in Growth Rates of Silicon . . . ", J. Crystal Growth, vol. 31, 1975, pp. 290-298.

Primary Examiner—L. Dewayne Rutledge
Assistant Examiner—W. G. Saba
Attorney, Agent, or Firm—Robert E. Burns; Emmanuel J. Lobato; Bruce L. Adams

[57] ABSTRACT

A method of fabricating a semiconductor integrated circuit device wherein a substrate having a particular crystallographic orientation is selectively etched so as to form surface depressions of different depths. An epitaxial layer is grown from a Si—H—Cl system on the surface of the substrate having the surface depressions formed therein. The epitaxial layer is grown under conditions effective to achieve faster lateral growth than vertical growth so as to form the epitaxial layer with regions of three different thicknesses. Subsequently, additional regions of the semiconductor integrated circuit are formed in the epitaxial layer regions of different thicknesses so as to complete the device.

5 Claims, 13 Drawing Figures

METHOD OF FABRICATING SEMICONDUCTOR INTEGRATED CIRCUIT DEVICE UTILIZING SELECTIVE ETCHING AND EPITAXIAL REFILL

BACKGROUND OF THE INVENTION

The present invention relates to a method of producing semiconductor integrated circuits, particularly to circuits having different thickness of epitaxial grown layers and different depths of embedded layers.

Transistors incorporated in the conventional semiconductor integrated circuits are formed in a substantially equalized n-type low impurity density layer. As a result, a limitation is imposed on the range of a controllable characteristic with the result that this has prevented the circuit from being high performance and multifunction. For these reasons, concave portions have been heretofore formed in the n-type low impurity density layer or the depth of the embedded area of the n-type high impurity density, for instance, has been changed. However, these methods according to the prior art have been disadvantageous in the fine work and yield as well as increasing the number of steps in the photolithography, diffusion, the growing steps and in the complexity thereof.

FIG. 1 illustrates a partial sectional view of an integrated circuit for explaining an example of a conventional manufacturing method. In this example, two static induction transistors (SIT) $T_1$ and $T_2$ are involved and the thickness of $n^-$ epitaxial growth layers 3 thereof are different. For instance, the SIT $T_1$ is of the upward type and the source electrode $S_1$ reaches the surface through an $n^+$ embedded (buried) layer 2 and an $n^+$ drawing domain 102. The SIT $T_2$ is a downward type in which the source electrode $S_2$ is arranged on the surface side and, in this embodiment, the drain electrode $D_2$ is drawn out from the surface through an $n^+$ region forming along an $n^+$ embedded layer 12, the side wall of the concave portion and the surface. The SIT $T_1$ is separated from the SIT $T_2$ by a deep $P^+$ separating or isolation layer 101 substantially reaching a P type substrate 1. In this example, the thickness of the $n^-$ region of the SIT $T_1$ is more than that of the SIT $T_2$ and the example illustrates a so called plane type device in which each of the gate $P^+$ regions 4 and 14 is formed on the same plane as the plane of the drain $n^+$ region 5 and the source $n^+$ region 15. The separation among the elements can be attained by the use of the deep convex portion (depression) reaching the substrate 1, a thick insulating film or the like other than such a PN junction.

FIGS. 2(a)-2(c) illustrate sectional views showing the fabricating process of a conventional integrated circuit. Refering to FIG. 2(a), after $n^+$ regions 2 and 12 are formed on a P type Si substrate by a selective diffusion process, all of the surface is exposed and an n type growth layer 3 is deposited by the epitaxial growth process. The $n^+$ embedded layers 2 and 12 rise up toward the growth layer side due to a high temperature treatment at the time of growing and the redistribution of the impurity. A $SiO_2$ film 6 is formed by oxidizing the surface and a $P^+$ diffusion layer 101 and an $n^+$ diffusion layer 102 are selectively formed, respectively. The formation of these diffusion layers 101 and 102 requires a high temperature treatment for a long time to obtain a deep layer. Therefore, the rediffusion in the $n^+$ embedded layers 2 and 12 is remarkably advanced so that a gentle distribution of the impulity density occurs on the side of the growth layer 3. This causes the increase of capacitance, the insufficient breakdown voltage characteristic or the deterioration of the frequency response characteristic. To obtain the deep diffusion depth, the degree of extension in the transverse direction is approximately equal to two times the thickness of the growth layer and the occupied width of the $P^+$ separating region 101 and the drawing $n^+$ region 102 can not be disregarded so that the increase of the integration density is hindered.

In the processes shown in FIG. 2(b), a part of the n type growth layer 3 for the SIT $T_2$ is selectively etched to be thin, and at the same time a part of the selective etching process for forming a drain drawing region 112 is carried out. FIG. 2(b) shows a sectional view after an oxidation step. Since the etched portion extends in the transversal direction when the selective etching is carried out, this process also prevent the integration density from increasing.

FIG. 2(c) illustrates a sectional view in which gate $P^+$ regions 4 and 14 of the SIT $T_1$ and $T_2$ were formed by the selective diffusion technique. Though it is preferable for lowering the capacitance and increasing a current gain that openings for a gate selective diffusion are small, the fine working for forming a gate opening of SIT $T_2$ on the bottom surface of the convex portion is very difficult due to the gap between a photomask and the surface. Moreover, due to the convex and the concave portions on the surface, the photo-resist can not be coated with uniform thickness. It sometimes occurs to cut off the resist film at the step portion and there will be a difference of exposure conditions for the upper surface and the bottom surface.

FIG. 2(d) is a sectional view showing that after the depth of the concave portion is increased by the selective etching technique so as to reach the drain $n^+$ region 12, the oxidation is carried out, an opening is defined in the $SiO_2$ layer, the selective diffusion is carried out, and the drain $n^+$ region 5 of the SIT $T_1$, the source $n^+$ region 15 of the SIT $T_2$ and the drain drawing $n^+$ region 112 are formed. For the selective etching technique for semiconductors, a chemically moist-type etching technique (HF—$HNO_3$ or a like alkaline substance such as KOH), a dry-type etching technique such as a plasma etching technique, sputtering etching technique or the like, a gas etching technique using a gas such as HCL and so on, can be used. In this case, it is also difficult to define the small openings on the bottom surface and to prevent the resist from cutting off at the step portions. After the above described steps, the steps of defining an opening for a contact, metal evaporation and selective etching for forming wiring are carried out to complete the device. However, due to the concave portions or the convex portions, the metal wiring is liable to cut off at the stepped portions and fine working for the bottom surfaces at the concave portions is difficult.

As described above, even in the fabrication of the SITs which are different in the thickness of n type growth layers 3, the decrease of the integration density, the difficulty of fine working for the bottom surface of the concave portion and the cutting of the resist at the stepped portions are liable to happen due to the increase of the time for heat treatment or the formation of deep concave portions. Such a problem will also occur in the integrated circuit involving junction transistors such as an n channel SIT and a npn bipolar transistor (BJT) or in the integrated circuit requiring growth layers with different thickness such as BJT integrated circuit, FET

DETAILED DESCRIPTION OF THE INVENTION

The present invention provide a method of producing a semiconductor integrated circuit in which the above discussed problems are alleviated. According to the present invention, it is possible to realize the surface of the device as a flat plane, to easily from the isolation layer of the embedded layer and to increase the integration density. The method according to producing of the present invention utilizes the feature of the layer growth in the crystal growth. It is necessary to properly select the crystal orientation of the substrate and the condition for epitaxial growth (major elements are a material, temperature, supplying amount of material, flowing speed the last two of which mainly contribute to the material supply rate in a CVD method).

Figure 3A:
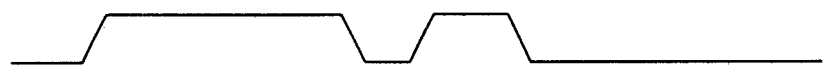
FIGS. 3(a) to 3(c) are diagramatical sectional views which illustrate a growth phenomenon utlized in the present invention; and, FIGS. 5(a) to 5(d) are sectional views which illustrate a method of producing of the present invention.

At first, a layer growth property utilized in the present invention will briefly be described. It has been proposed that an epitaxial growth for a semiconductor crystal such as Si, GaAs is based on the layer growth mechanism described in the Semiconductor Research Vol. 7, pages 131 to 165 (1971), and the Semiconductor Research Vol. 11, pages 55 to 86 (1975). According to this growth mechanism, epitaxial growing speed on the specific crystal surface with a low index of (111), (113), (110), and (112) is extremely faster in the transverse direction than in the vertical direction and the speed in the transversal direction reaches approximately 100 to 1000 times the speed in the vertical direction. For this reason, the flat growth surface in an atomic scale which has error less than 0.2° against the perfect crystal surface, a so called "facet", can be formed on these crystal surfaces. In the case of such a facet with the concave or the convex portions on the surface as shown in FIG. 3(a), after short growing, the concave portions will be immediately filled up. Since the growing speed in the transverse direction reaches some hundred μ/mm, the convex portion with a width of less than 100 μm can be filled up within one minute so that the height of the deposition in the vertical direction will be less than 1 μm.

Figure 3B:
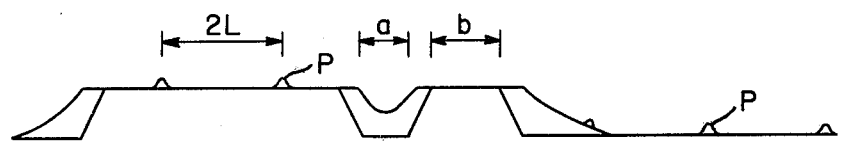
Figure 3C:

When the substrate grows as shown in FIG. 3(a), in the first stage, the filling of the concave portion begins by filling the bottom thereof as shown in FIG. 3(b). At the same time, a growing nucleus in the form of a small hill is produced on the surface apart from the side of the concave portion because the atom absorption on the surface moves to a step in which the atom can be in a stable condition. If there is no step adjacent thereto, growing nuclei are formed by the gathering of some atoms. Since a half of the average distance 2 L (1/Ni = πL², where Ni is the density of growing nuclei) of the growing nuclei, that is L, is approximately equal to the diffusion length of an atom, the occurrence of a growth nucleus within the distance L from the step becomes difficult. Most atoms contribute to the transverse growth. The growing nuclei will be produced in other distance ranges, and the growth component in the vertical direction is produced. Therefore, flat growing is carried out so as to form a flat surface when the width of the bottom is less than 2 L, and no growing on the surface occurs when the width b of the upper surface is less than 2 L. The longer growing in the vertical direction occurs by producing the growing nuclei when the widths of a and b are larger than 2 L. A diagramatical view of the example discussed is illustrated in FIG. 3(c). The distance 2 L between growing nuclei 2 L is varied in accordance with the condition of growing, and the distance increases with the growing speed. The distance also decreases with the increase of the supplying amount of the raw material. One example of these factors is described in the Semiconductor Research Vol. 11, page 65, FIG. 3.21 and in the Journal of Crystal Growth Vol. 31, page 290, FIG. 7 (1975). In a hydrogen reduction method using $SiCl_4$, the value of 2 L is approximately from some ten μm to some hundred μm under the condition of 1200 [°C.] and the orientation of (111). The results for the use of $SiH_4$ is similar to that of $SiCl_4$, and for instance, the result for (100) are shown in the Journal of Crystal Growth Vols. 3 and 4, page 43 (1968) and in the Semiconductor Research Vol. 11, page 69, FIG. 3.31 and FIG. 3.32 (1975).

Figure 1:
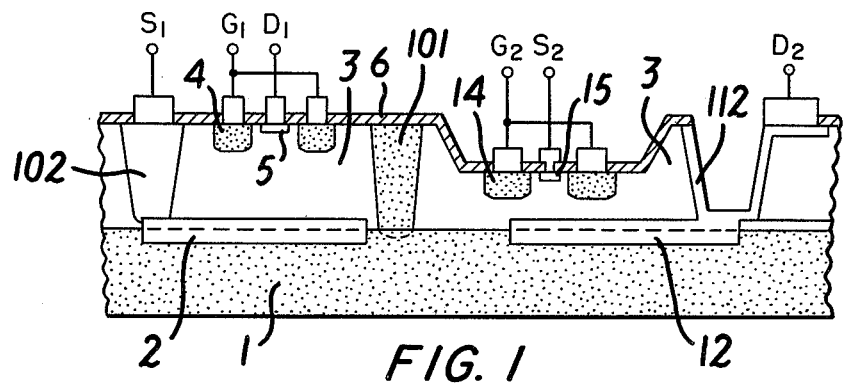
FIG. 1 is a sectional view showing a conventional constructure of an integrated circuit involving SITs in which thickness of n⁻ regions are different among them.
Figure 2A:
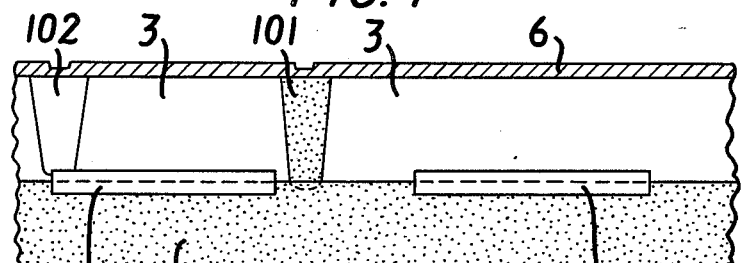
FIGS. 2(a) to 2(d) are sectional views using for the explanation of the conventional processes to form the constructure shown in FIG. 1.
Figure 2B:
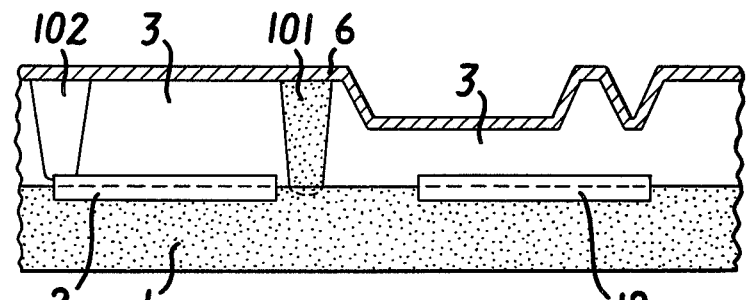
Figure 2C:
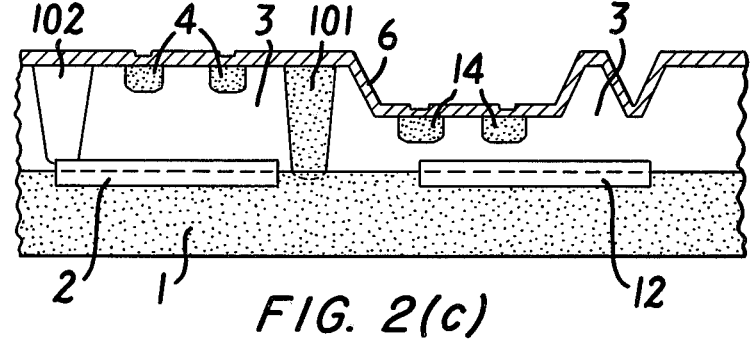
Figure 2D:
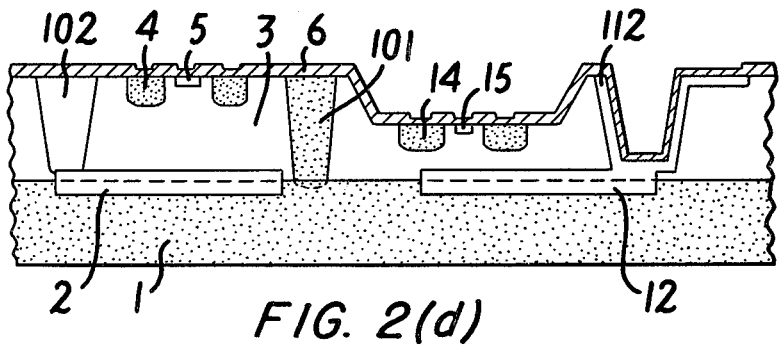

In the Si—H—Cl system, the pyramidal density varies with growth temperature having an activation energy of 1.73–2.6 eV (as described in line 24 of the left column on page 271 in the J. Crystal Growth, vol. 23 (1974) pp. 267–274) and also increases proportionally with supply rate of input material, R, as shown in FIG. 1 on page 291 in the J. Crystal Growth vol. 31 (1975) pp. 290–298. The supply rate R can be calculated from the experimental procedure of the latter reference as R = line velocity X material contents X $(22.4 \times 10^3)^{-1}$ X (Avogadros number). For example, $R = 1.78 \times 10^{18}$ molecules/cm². sec when line velocity is 4.4 cm/sec and material contents is 0.015. The pyramidal density Ni can be described as $$Ni \propto R \exp\left(-\frac{1.73 - 2.6eV}{kT}\right) \simeq R \exp\left(-\frac{2eV}{kT}\right).$$

since average half distance L of pyramids is $L = (\pi Ni)^{-\frac{1}{2}}$, we can derive the relation of L, R and T using FIG. 1 of the latter reference, as $2L \doteq 1.25 \times 10^{11} R^{-\frac{1}{2}} \exp(-1 \text{ eV}/kT)$ cm.

Figure 4:
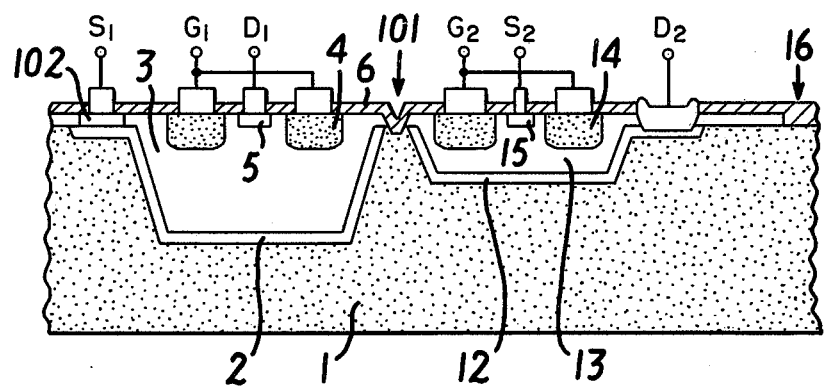

The above described phenomenon is positively utilized in the present invention. As a result, for example, the structure of the integrated circuit as shown in FIG. 4 can be realized in correspondence to that of FIG. 1. In FIG. 4, as well as the structure shown in FIG. 1, the device has SITs $T_1$ and $T_2$ with different thickness of n⁻ regions, respectively, and one is separated from the other by a concave portion 101. This embodiment shows the device in which electrode portions for embedded n⁺ regions 2 and 12 are formed by n⁺ region 102 or the concave portion (see $D_2$) on the surface. The method of producing of the present invention will be described in more detail in conjunction with FIGS.

5(a)–5(d) and comparing than with the embodiment of FIG. 4.

Figure 5A:
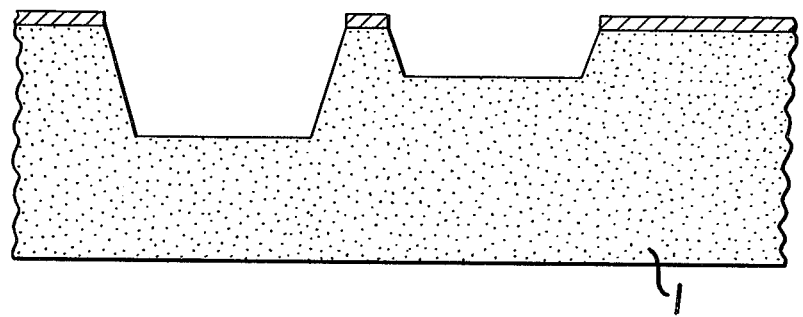

FIG. 5(a) illustrates a sectional view of a Si substrate before an n⁻ epitaxial growth treatment. The major surface of the P type substrate 1 is completely a low index crystal surface of (111), (113), (112), or (110) I 0.2°. This is a particular orientation which is different from the usual integrated circuit substrate having a different orientation by some degrees to avoid pattern shift or washing out on the epitaxial layer. Our invention utilizes the exact low-index surface which is avoided in the prior art. The substrate 1 shown in FIG. 5(a) has concave portions which are different in depth by at least by a factor of two and are formed by a selective operation.

Figure 5B:
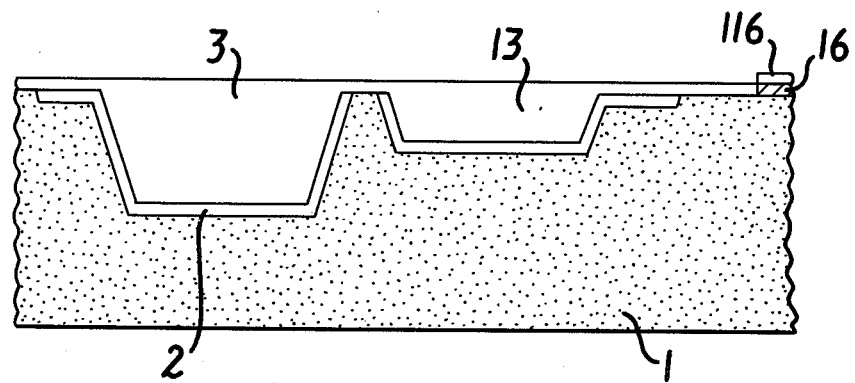

FIG. 5(b), n+ embedded (buried) layers 2 and 12 are formed and a diffusion operation is carried out to the side face of upper face in accordance with the present invention. An insulating film 16 such as an oxide film (or a nitride film) is left on unnecessary portions of the substrate on which a semiconductor device is not formed. This is utilized as a reference position marker in the following steps. A growth layer with an n type low impurity density is formed on the substrate 1 by a hydrogen reduction method using a halogenide such as $SiCl_4$, $SiHCl_3$, $SiH_2Cl_2$ or a thermal decomposition method using $SiH_4$ or $SiH_2Cl_2$, particularly the Si—H—Cl system. Due to the particular low index in the major surface, the growth speed in the transverse direction is high so that the concave portions can be filled up within some minutes. After this, the growth in the vertical direction is almost stopped so that the surface of the growth layer becomes flat. Of course, it is possible to obtain a step difference less than that of the concave and the convex portions in the substrate 1 by stopping the growth before the concave portions are completely filled up in accordance with a purpose. It is also possible to reduce the areas of the concave portions. As described in conjunction with FIGS. 3(a)–3(c), a larger flat layer can be obtained as the width of the upper surface of the concave portion or the concave portion becomes smaller than the average distance 2 L between the growing nuclei. Subsequently, the diffusion operation is selectively carried out in the filled concave portions.

Even if the concave portions are completely filled up, since the growing speed in the vertical direction is slow, the thickness of the growth layer on the upper surface of the convex portion is extremely thin. When the surface becomes completely flat, the positioning operation for the device pattern becomes difficult. Therefore, in this case, the insulating film 16 on the surface of the convex portion acts as a positioning marker. Although the growth of a polycrystal 116 sometimes occurs on the insulating film, it can be removed therefrom if necessary. It is also possible to reduce the area of the insulating film and to prevent the polycrystal from being deposited when the growing is carried out under the existance of HCl, HBr or the like.

Figure 5C:
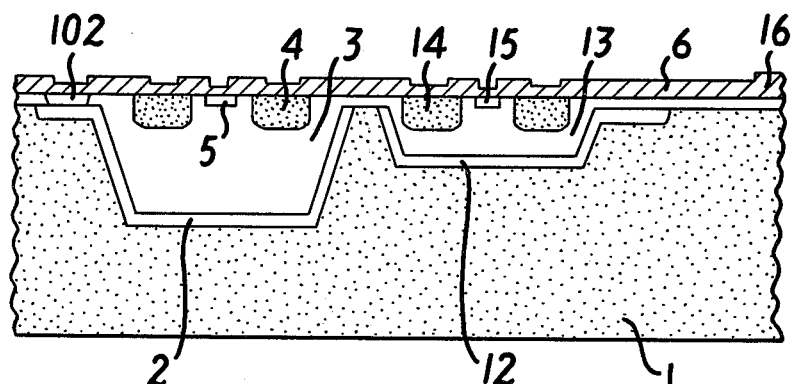
Figure 5D:
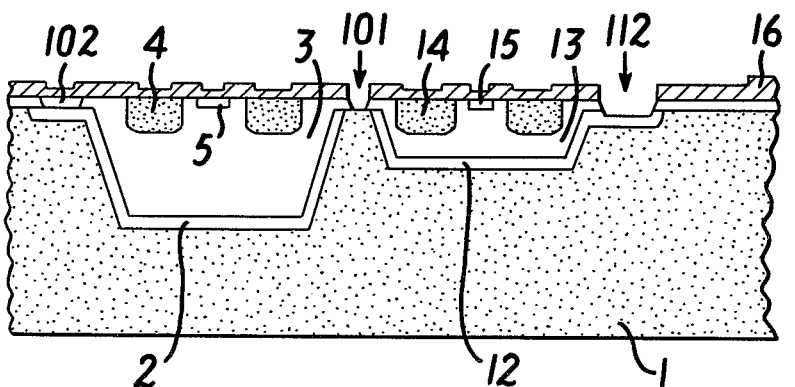

Subsequently, as shown in FIG. 5(c), n+ embedded drawing region 102 formed together with P+ gate regions 4 and 14 and drain n+ regions 5 and 15 is easily formed by a conventional process. Since the surface is substantially flat, the photolithography for the fine pattern can be easily carried out, and moreover, the problems described in conjunction with FIGS. 1 and 2 are eliminated due to the uniform thickness of the resist. As shown in FIG. 5(d), the separation among the elements and drawing the electrode can be attained by forming the concave portions 101 and 102, if necessary. As no layer is grown substantially growing on the upper surfaces of the convex portions, what layer there is can be removed by etching over all of the surface and the oxidation process after the step of epitaxial growth. Therefore, the isolating portion 101, n+ diffusion layer 112 for embedded-drawing and the concave portion 102 become unnecessary so that the processes are simplified.

According to the method for producing an integrated circuit according to the present invention, even if some epitaxial growth layers with different thickness are involved in one chip, the flat top surface can be obtained. Isolating and drawing the embedded layers can be easily carried out by a shallow diffusion treatment or an etching treatment (sometimes no such a treatment is required). The present invention is applicable to any device having a side wall of a concave portion, and a part thereof can be used as an isolating layer or a drawing portion as it is. As a result, the distance between the elements is reduced so that the integration density is extremely increased.

The problems of the nonuniform distribution of thickness of the resist and the cutting off at the stepped portions described in conjunction with FIGS. 1 and 2, are solved so that a simplification of the processes and an increase of yield can be expected.

Although the upward SIT $T_1$ is formed in the thicker n⁻ region in the example given of the integrated circuit constructure of the present invention, since it is desired that the series resistance rs between the source electrode and the channel is smaller for a characteristic of SIT, the formation of the upward SIT in the thinner n⁻ region is desirable in most cases. Although an n+ region continued from the bottom face is formed on the side face of the concave portion on the P type substrate 1 for drawing the n+ embedded region in FIG. 4, it is not necessarily required. Since a part of the P type substrate 1 is used as the separating region in the present invention, punch-through is liable to happen as the width of the isolating region becomes narrow and the impurity density becomes low. In this case, although a parasitic transistor effect becomes large, in order to remove the effect, it is effective for obtaining high integration density to form a P type diffusion layer or an ion implanted layer.

A device involving two vertical type SITs each with different thickness of its respective n⁻ region has been described as a concreat embodiment of the present invention, however, the description will be applicable to a device having more than three different thicknesses of its n⁻ region. Since a flat surface can be obtained even if the concave portion is formed and a P⁻ growing process is carried out after an n⁻ growing process, the present invention is also applicable to an integrated circuit involving an n channel and a P channel with various thickness of high resistance layers. For this reason, the present invention is applicable to a device involving junction transistors such as the SIT, the BJT and the FET, the device consisting of only transistors, the device having no vertical transistor but a lateral transistor, or the device having an n channel transistor, a P channel transistor, an npn transistor, a pnp transistor, or the passive elements. Although one transistor is formed in one concave portion in the above described embodiment, it is possible to contain more than one transistor in one concave portion in accordance with a separating layer and a drawing electrode.

The phenomenon utilized in the present invention is not known only for silicon, but for a III-V multi-compound such as Ge, GeAs, GeP, or a mixed crystal thereof. In addition to the vapor growth method, a liquid growth method or a molecular beam epitaxial growth method can be used. The application range of the present invention is very wide, and the present invention has the above described advantages and the industrial value thereof is remarkable.

What is claimed is:

1. A method of fabricating a semiconductor integrated circuit device, comprising the steps of:
    providing a semiconductor substrate having a main surface having a low-index crystallographic surface orientation substantially within ±0.2° of a selected one of the crystallographic orientations (111), (113) (112) and (110);
    disposing a masking film on said semiconductor substrate main surface in a configuration to leave exposed portions of said semiconductor substrate main surface to be etched;
    selectively etching said exposed portions of said semiconductor substrate main surface to form surface depressions in said semiconductor substrate main surface, wherein at least one of said surface depressions has a depth different from the others;
    removing said masking film to expose said semiconductor substrate main surface including unetched portions thereof;
    forming an epitaxial layer on said semiconductor substrate main surface from a Si—H—Cl system under conditions effective to achieve faster lateral growth than vertical growth so as to form the epitaxial layer with regions of three different thicknesses, first and second epitaxial layer regions of different thickness being formed at least partially filling said surface depressions of different depths, and a third epitaxial layer region of different thickness being formed overlying unetched portions of said semiconductor substrate main surface; and
    forming additional regions of said semiconductor integrated circuit in said first and second epitaxial layer regions and at least one of isolation regions and electrodes in said third epitaxial layer regions so as to complete said semiconductor integrated circuit.

2. A method of fabricating a semiconductor integrated circuit device as claimed in claim 1, wherein the steps of disposing a masking film on and selectively etching said semiconductor substrate main face are carried out so that $b > 2$ $L \simeq 1.25 \times 10^{11} R^{-\frac{1}{2}} \exp(1 \text{ ev}/kT)$ cm, wherein b is the width of the unetched portion of said semiconductor substrate main surface, 2 is the average distance between growth nuclei of said epitaxial layer under the conditions which said epitaxial layer is grown, R is the supply rate of input material in molecules/cm$^2$. sec at the substrate position in the Si—H—Cl system, and T is the absolute temperature of the substrate.

3. A method of fabricating a semiconductor integrated circuit device as claimed in claim 2, further comprising the step of forming high impurity concentration semiconductor regions in said surface depressions on portions of the bottom and sides thereof up to adjacent portions of said unetched main surface before the step of forming said epitaxial layer.

4. A method of fabricating a semiconductor integrated circuit device as claimed in claim 3, wherein said high impurity concentration semiconductor regions have a conductivity type opposite that of said substrate, and said semiconductor integrated circuit device is comprised of junction transistors.

5. A method of fabricating a semiconductor integrated circuit device as claimed in claim 1, 2, 3 or 4, further comprising the step of forming an insulating film on a predetermined portion of said semiconductor substrate main surface before the step of forming an epitaxial layer so as to form a position reference, and carrying out subsequent steps relative to said position reference.

* * * * *